(12) United States Patent
Kim et al.

(10) Patent No.: US 9,224,986 B2
(45) Date of Patent: Dec. 29, 2015

(54) ORGANIC LIGHT-EMITTING DISPLAY DEVICE AND METHOD OF MANUFACTURING SAME

(71) Applicant: Samsung Display Co., Ltd., Yongin, Gyeonggi-do (KR)

(72) Inventors: Doo-Hwan Kim, Yongin (KR); Il-Hwa Hong, Yongin (KR); Sang-Ha Park, Yongin (KR)

(73) Assignee: Samsung Display Co., Ltd. (KR)

( * ) Notice: Subject to any disclaimer, the term of this patent is extended or adjusted under 35 U.S.C. 154(b) by 62 days.

(21) Appl. No.: 13/801,872

(22) Filed: Mar. 13, 2013

(65) Prior Publication Data

US 2014/0158994 A1    Jun. 12, 2014

(30) Foreign Application Priority Data

Dec. 10, 2012   (KR) .................. 10-2012-0142904

(51) Int. Cl.
  *H01L 51/52* (2006.01)
  *H01L 51/56* (2006.01)
  *H01L 27/32* (2006.01)
  *H01L 51/00* (2006.01)

(52) U.S. Cl.
  CPC .......... *H01L 51/5284* (2013.01); *H01L 27/322* (2013.01); *H01L 51/5209* (2013.01); *H01L 51/5234* (2013.01); *H01L 51/5253* (2013.01); *H01L 51/0096* (2013.01)

(58) Field of Classification Search
  USPC ....................................... 438/35
  See application file for complete search history.

(56) References Cited

U.S. PATENT DOCUMENTS

| | | | |
|---|---|---|---|
| 2005/0264723 A1 | 12/2005 | Lee | |
| 2006/0125390 A1 | 6/2006 | Oh | |
| 2007/0003743 A1* | 1/2007 | Asano et al. | 428/201 |
| 2010/0013383 A1* | 1/2010 | Kim et al. | 313/504 |
| 2011/0284898 A1* | 11/2011 | Iwasaki | 257/98 |
| 2013/0153870 A1* | 6/2013 | Seo et al. | 257/40 |

FOREIGN PATENT DOCUMENTS

| | | |
|---|---|---|
| JP | 2007-280791 | 10/2007 |
| KR | 10-2005-0112974 | 12/2005 |
| KR | 10-2011-0029755 | 3/2011 |
| KR | 10-2011-0053017 | 5/2011 |
| KR | 10-2012-0041459 | 5/2012 |

OTHER PUBLICATIONS

Office Action dated Jun. 2, 2014 in Korean Priority Application No. 10-2012-0142904.

* cited by examiner

*Primary Examiner* — Stephen W Smoot
(74) *Attorney, Agent, or Firm* — Knobbe Martens Olson & Bear LLP

(57) ABSTRACT

An organic light-emitting display device includes a substrate; a passivation layer disposed on the substrate; at least one color filter disposed on the passivation layer; an overcoat layer covering the at least one color filter; a first electrode disposed on the passivation layer and surrounding the overcoat layer; a second electrode facing the first electrode; and an organic layer disposed between the first electrode and the second electrode.

19 Claims, 7 Drawing Sheets

ORGANIC LIGHT-EMITTING DISPLAY DEVICE AND METHOD OF MANUFACTURING SAME

CROSS-REFERENCE TO RELATED APPLICATIONS

This application claims the benefit of Korean Patent Application No. 10-2012-0142904, filed on Dec. 10, 2012, in the Korean Intellectual Property Office, the disclosure of which is incorporated herein in its entirety by reference.

BACKGROUND

1. Field

The present disclosure relates to an organic light-emitting display device that has a structure in which sub pixels are individually closed, and a method of manufacturing the same.

2. Description of the Related Technology

In general, an organic light-emitting diode (OLED) has a structure in which an organic light-emitting layer in a functional thin-film shape is inserted between an anode and a cathode, and the OLED is a device that emits lights while electrons and holes are recombined in the organic light-emitting layer, the holes being injected from the anode and the electrons being injected from the cathode.

The OLED is classified into a passive matrix type using a passive driving scheme and an active matrix type using an active driving scheme. In the case of the passive matrix OLED (PM-OLED), anodes and cathodes are respectively arranged in columns and rows, scanning signals are supplied from a row driving circuit to the anodes, and in this case, only one of the rows is selected. In addition, data signals are input to each pixel in a column driving circuit. The active matrix OLED (AM-OLED) controls signals input to each pixel by using a thin-film transistor and is being widely used as a display device for reproducing moving pictures because it is suitable for processing enormous signals.

Currently, RGB-independent deposition of a top emission type is being widely used so as to implement the AM-OLED with low power consumption and high bright room contrast ratio (CR) properties. In the RGB-independent deposition, patterning is performed by each color to be emitted by using a micro metal mask during manufacturing processes, but it is difficult to apply the RGB-independent deposition to a large device due to precision when the metal mask is aligned or due to sagging that occurs because the size of the mask increases. An inkjet scheme that is another RGB-independent light-emitting layer forming scheme which has an advantage that it may be used for a large substrate, but it needs to first secure material properties because the properties of the current soluble material are worse than those of a material for deposition. There is also a laser induced thermal image (LITI) technique that independently transfers the light-emitting layer disposed on a donor film with a laser, but it has a drawback of decreasing the life of the OLED.

SUMMARY OF CERTAIN INVENTIVE ASPECTS

According to an aspect of the present invention, there is provided an organic light-emitting display device including a substrate; a passivation layer disposed on the substrate; at least one color filter disposed on the passivation layer; an overcoat layer covering the at least one color filter; a first electrode disposed on the passivation layer and surrounding the overcoat layer; a second electrode facing the first electrode; and an organic layer disposed between the first electrode and the second electrode.

The at least one color filter may be one of a red filter, a green filter, or a blue filter.

The display device may further include a polarizing film on one side of the substrate.

The display device may further include a black matrix formed on the first electrode and including a light transmitting region and a light blocking region.

The display device may further include a black matrix formed between the substrate and the passivation layer and including a light transmitting region and a light blocking region.

The display device may further include a pixel defining layer formed on the first electrode and including a pixel region and a non-pixel region.

A thickness of the color filter may be about 1 μm to about 5 μm.

A thickness of the overcoat layer may be about 1 μm to about 10 μm.

The passivation layer may include SiOx or SiNx.

The first electrode may be formed of one or more combinations selected from the group consisting of ITO, IZO, ZnO, and In2O3.

According to another aspect of the present invention, there is provided a method of manufacturing an organic light-emitting display device including providing a substrate; disposing a passivation layer on the substrate; disposing at least one color filter on the passivation layer; disposing an overcoat layer covering the at least one color filter; disposing a first electrode on the passivation layer to surround the overcoat layer; disposing an organic layer on the first electrode; and disposing a second electrode on the organic layer.

The passivation layer is formed of a SiOx-based layer or a SiNx-based layer.

The thickness of the color filter is formed to be about 1 μm to about 5 μm.

The thickness of the overcoat layer is formed to be about 1 μM to about 10 μm.

The method may further include forming a pixel defining layer on the first electrode and including a pixel region and a non-pixel region.

The method may further include disposing a polarizing film on one side of the substrate.

The method may further include forming a black matrix on the second passivation layer and including a light transmitting region and a light blocking region.

The method may further include forming a black matrix on the substrate and including a light transmitting region and a light blocking region.

The first electrode may be formed of one or more combinations selected from a group consisting of ITO, IZO, ZnO, and In2O3.

BRIEF DESCRIPTION OF THE DRAWINGS

The above and other features and advantages of the present invention will become more apparent by describing in detail certain embodiments thereof with reference to the attached drawings in which:

FIG. 7A is a sectional view illustrating a state after providing a substrate according to another embodiment of the present invention implementing the circuit of FIG. 1;

FIG. 7B is a sectional view illustrating a state after disposing a passivation layer on the substrate of FIG. 7A;

FIG. 7C is a sectional view illustrating a state after disposing at least one CF on the passivation layer of FIG. 7B;

FIG. 7D is a sectional view illustrating a state after disposing an overcoat layer that covers the color filter of FIG. 7C;

FIG. 7E is a sectional view illustrating a state after disposing a first electrode on the passivation layer to surround the overcoat layer of FIG. 7D;

FIG. 7F is a sectional view illustrating a state after disposing a pixel defining layer on the first electrode of FIG. 7E;

FIG. 7G is a sectional view illustrating a state after disposing an organic layer on the first electrode and the pixel defining layer of FIG. 7F; and FIG. 7H is a sectional view illustrating a state after disposing a second electrode on the organic layer of FIG. 7G.

DETAILED DESCRIPTION OF CERTAIN INVENTIVE EMBODIMENTS

Expressions such as "at least one of," when preceding a list of elements, modify the entire list of elements and do not modify the individual elements of the list.

The present invention may make various changes and have several embodiments; therefore specific embodiments will be illustrated on the drawings and described in the detailed description in detail. However, this is not intended to limit the present invention to specific embodiments but should be understood as including all changes, equivalents and replacements that fall within the spirit and technical scope of the present invention. Detailed descriptions related to well-known technologies are omitted in order not to unnecessarily obscure subject matters of the present invention.

Though terms like "a first" and "a second" may be used to describe various components, the components should not be limited to these terms. The terms are used only for the purpose of distinguishing one component from another component.

The terms used herein are used just to describe specific embodiments and are not intended to limit the present invention. The terms of a singular form may include plural forms unless being used as explicitly different meaning on the context. It should be understood that the term like "comprises", "includes", or "has" is herein intended to designate that there is a feature, a numeral, a step, an operation, a component, a part or their combination described in the specification and do not exclude one or more other features, numerals, steps, operations, components, parts or their combinations.

Considering processes and yields, a white OLED color filter (WOLED-CF) scheme that employs a color filter in a WOLED takes center stage. The WOLED-CF scheme has a structure that uses the CF for color patterning and applies an overcoat layer for flattening it. However, the CF and the overcoat layer emit outgas from materials unlike inorganic films, thus there is a limitation that pixel shrinkage due to the deterioration of an organic light emitting layer occurs.

Embodiments of the present invention provides an organic light-emitting display device and a method of manufacturing the same that may effectively block outgases emitted from a color filter and an overcoat layer.

Certain embodiments of the present invention will be described in more detail below with reference to the accompanying drawings.

Figure 1:
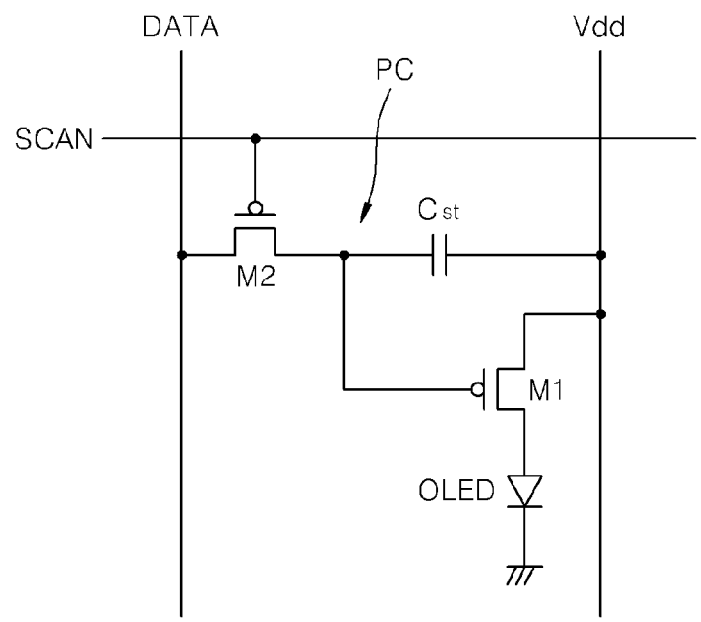
FIG. 1 is a circuit diagram representing a pixel circuit for one pixel of an active driving organic lighting-emitting display device according to an embodiment of the present invention.

FIG. 1 is a circuit diagram representing a pixel circuit for one pixel of an active driving organic lighting-emitting display device according to an embodiment of the present invention.

Referring to FIG. 1, the organic light-emitting display device according to an embodiment includes a plurality of pixels R, G and B that are connected to a plurality of signal lines and are arranged in a substantially matrix type, and each of the pixels has a pixel circuit (PC).

Each pixel includes a data line DATA, a scan line SCAN, and a power supply line Vdd that is a power supply for driving the OLED. The PC is electrically connected to the DATA, the SCAN, and the Vdd, and controls the light emission of the OLED.

Each pixel includes a capacitor unit Cst, an OLED, and at least two thin film transistors (TFT): a switching TFT M2 and a driving TFT M1.

The M2 is turned on/off by the scan signals applied to the SCAN and transfers the data signals applied to the DATA, to the Cst and the M1. The switching device is not necessarily limited to the M2 as illustrated in FIG. 1 but may include a switching circuit that includes a plurality thin film transistors and a plurality of capacitors and may further include a circuit that compensates the threshold voltage, Vth, of the M1 or the voltage drop of the Vdd.

The M1 determines the amount of current flowing to the OLED according to the data signals transferred through the M2.

The Cst stores the data signals transferred through the M2, for one frame.

Although the M1 and the M2 are illustrated as P-channel metal oxide semiconductor TFTs (PMOS TFT) in the circuit diagram in FIG. 1, embodiments are not limited thereto, and at least one of the M1 and the M2 may be formed of an N-channel metal oxide semiconductor TFT (NMOS TFT). In addition, the numbers of the TFTs and the capacitors are not limited thereto and a larger number of TFTs and a larger number of capacitors may be included.

Figure 2:
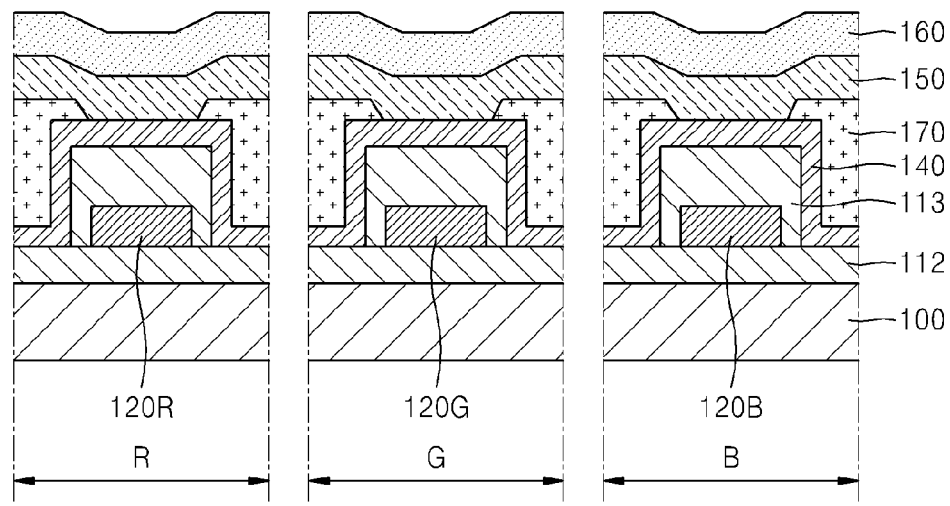
FIG. 2 is a sectional view schematically illustrating three neighboring pixels R, G, and B in an organic lighting-emitting display device according to an embodiment of the present invention implementing the circuit of FIG. 1.
Figure 3:
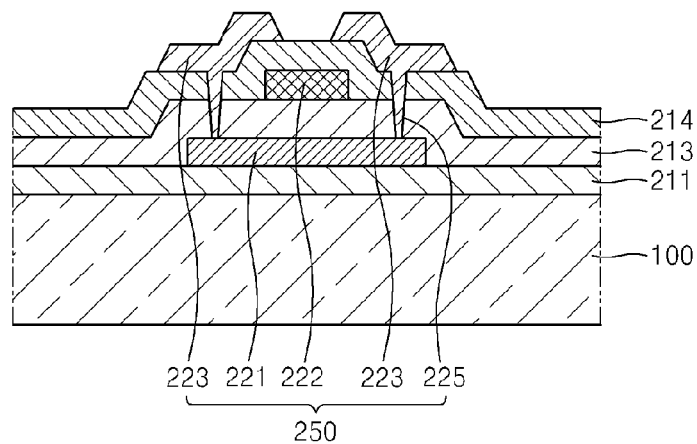
FIG. 3 is a sectional view schematically illustrating a driving circuit of FIG. 2.

FIG. 2 is a sectional view schematically illustrating three neighboring pixels R, G, and B in an organic lighting-emitting display device according to an embodiment of the present invention implementing the circuit of FIG. 1. FIG. 3 is a sectional view schematically illustrating a driving circuit of FIG. 2.

The three pixels including a red pixel R, a green pixel G, and a blue pixel B may be repeated along rows and/or columns and the arrangement of the pixels may vary.

Referring to FIG. 2, the organic light-emitting display device according to an embodiment includes the R, the G, and the B on a substrate 100. In addition, the display device includes red, green, and blue filters 120R, 120G, and 120B corresponding to each pixel and the filters selectively absorb white lights emitted from each pixel.

The substrate 100 is a transparent one and a silicon dioxide (SiO2)-based glass substrate may be used. The substrate 100 is not necessarily limited thereto but may be formed of a plastic material or a metal material.

A driving TFT 250 may be disposed on the top of the substrate 100 as illustrated in FIG. 3. The embodiment of FIG. 3 illustrates a top-gate-type TFT as an example of a TFT. However, other TFTs with different structures may be used.

Before disposing the TFT 250 on the top of the substrate 100, an insulating layer 211 such as a barrier layer and/or a buffer layer may be formed to prevent impurity ions from spreading, and moisture or external air from penetrating, and to flatten the surface. The insulating layer 211 may be formed of SiOx and/or SiNx.

The active layer 221 of the TFT is formed of a semiconductor material on the insulating layer 211 and a gate insulating layer 213 is formed to cover it. The active layer 221 may be formed of inorganic semiconductor such as amorphous silicon or polysilicon or organic semiconductor, and has a source region, a drain region, and a channel region in between the source and drain regions.

The active layer 221 may be formed of polysilicon and may be doped with dopant. The active layer 221 may be formed of amorphous silicon instead of polysilicon and may also be formed of various organic semiconductor materials such as, for example, pentacene.

The active layer 221 may be formed of an oxide semiconductor. For example, the oxide semiconductor may include metal elements in 12, 13, and 14 groups, such as zinc (Zn), In, Ga, tin (Sn), cadmium (Cd), Ge, or Hf, and oxides of the materials selected from their combinations. For example, the active layer 221 may include G-I-Z-O[(In2O3)a(Ga2O3)b (ZnO)c] (where a, b and c all are real numbers that satisfy a≥0, b≥0, c>0).

The gate insulating layer 213 is disposed to insulate between the active layer 221 and the gate electrode 222. The gate insulating layer 213 may be formed of an insulating material such as a silicon oxide or a silicon nitride and may be formed of other insulating organic materials.

The gate electrode 222 is disposed on the gate insulating layer 213 and an interlayer insulating layer 214 is disposed to cover it. In addition, source and drain electrodes 223 are connected to the active layer through a contact hole 225 on the interlayer insulating layer 214.

The gate electrode 222 may be formed of various conductive materials. For example, the gate electrode may be formed of Mg, Al, Ni, chrome (Cr), Mo, W, MoW, or platinum (Au) and it is also possible to make various variations such as forming as a plurality of layers as well as single layer.

The interlayer insulating layer 214 may be formed of an insulating material such as a silicon oxide or a silicon nitride and may be formed of other insulating organic materials. By selectively removing the interlayer insulating layer 214 and the gate insulating layer 213, a contact hole 225 through which source and drain regions are exposed may be formed. In addition, the source and drain electrodes 223 may be formed of the above-described material for the gate electrode 222 as single layer or a plurality of layers on the interlayer insulating layer 214 so that the contact hole 225 is filled.

The source and drain electrodes 223 of the TFT 250 may be electrically connected to the lower electrode of a pixel.

The TFTs formed in this way are covered and protected with a passivation layer 112. The passivation layer 112 may use an inorganic insulating layer and/or an organic insulating layer, may include SiOx, SiNx, a silicon oxynitride (SiON), an aluminum oxide (Al2O3), a titanium dioxide (TiO2), a tantalum oxide (Ta2O5), a hafnium dioxide (HfO2), a zirconium dioxide (ZrO2), BST, PZT as the inorganic insulating layer, and may include general polymers (polymethyl methacrylate (PMMA), polystyrene (PS)), polymer derivatives with a phenol group, acryl-based polymers, imide-based polymers, arylether-based polymers, amide-based polymers, fluorine-based polymers, p-xylene-based polymers, vinylalcohol-based polymers, and their blend, as the organic insulating layer. The passivation layer 112 may also be formed of a complex stack of the inorganic insulating layer and the organic insulating layer.

The red filter 120R corresponding to the R, the green filter 120G corresponding to the G, and the blue filter 120B corresponding to the B are disposed on the passivation layer 112. The color filters 120R, 120G, and 120B may be formed by patterning after coating. The color filters 120R, 120G, and 120B may be formed with a thickness of about 1 μm to about 5 μm to satisfy target color coordinates.

The color filters 120R, 120G, and 120B may be arranged in a color filter on array (COA) scheme. The color filters 120R, 120G, and 120B receive white lights from each pixel and generate lights of different colors.

Overcoat layers 113 may be disposed on the color filters 120R, 120G, and 120B to protect the color filters and to flatten the surface of a layer on which the color filters are disposed. The overcoat layers 113 individually cover each of the color filters 120R, 120G, and 120B. The overcoat layer 113 may be formed by leaving only a required region, namely a light-emitting region, and removing the other regions by using a photo process after coating. The overcoat layer 113 may be formed to be a thickness of about 1 μm to about 10 μm depending on taper and flatness. The overcoat layer 113 may use an inorganic insulating layer and/or an organic insulating layer, may include SiO2, SiNx, a silicon oxynitride (SiON), an aluminum oxide (Al2O3), a titanium dioxide (TiO2), a tantalum oxide (Ta2O5), a hafnium dioxide (HfO2), a zirconium dioxide (ZrO2), BST, PZT as the inorganic insulating layer, and may include general polymers (polymethyl methacrylate (PMMA), polystyrene (PS)), polymer derivatives with a phenol group, acryl-based polymers, imide-based polymers, arylether-based polymers, amide-based polymers, fluorine-based polymers, p-xylene-based polymers, vinylalcohol-based polymers, and their blend, as the organic insulating layer. The overcoat layer 113 may also be formed of a complex stack of the inorganic insulating layer and the organic insulating layer. In addition, a material with high transmittance may be used considering light-emitting efficiency.

A first electrode 140 is disposed on the passivation layer 112 to surround the overcoat layer 113. The first electrode 140 may be formed a conductive material such as ITO, IZO, a zinc oxide (ZnO), or an indium oxide (In2O3). In addition, the first electrode 140 may be formed wholly on the substrate 100. In addition, the first electrode 140 may be formed so that a given pattern is formed pixel by pixel by photolithography.

The first electrode 140 may be electrically connected to a lower TFT. The first electrode 140 is connected to an external electrode terminal (not illustrated) to be able to work as an anode.

As a result, the overcoat layers 113 individually cover each color filter 120R, 120G, 120B and the first electrode 140 is formed to surround the overcoat layers 113. Thus, a structure in which each of the color filters 120R, 120G, and 120B is individually closed may be formed. Due to such a structure, outgases are effectively blocked to be able to prevent pixel shrinkage by the deterioration of an organic light-emitting layer and enhance the reliability of products.

A pixel defining layer 170 that separates a pixel region from a non-pixel region may be formed on the first electrode 140.

The R, G, and B corresponding to the red, green blue filters 120R, 120G, and 120B are formed on the overcoat layers 113. Each of the R, G, and B includes a first electrode 140, an organic layer 150, and a second electrode 160.

The second electrode 160 is disposed on the organic layer 150 to face the first electrode 140. The second electrode 160 may be a common type in which the second electrode of each pixel is bound in common by front deposition of a second conductive material such as Li, calcium (Ca), lithium fluoride/calcium (LiF/Ca), LiF/Al, Al, silver (Ag), Mg, barium (Ba), or their compounds. The second electrode 160 is connected to an external electrode terminal (not illustrated) to be able to work as a cathode.

The polarities of the first electrode 140 and the second electrode 160 may be opposite from the above.

The organic layer 150 between the first electrode 140 and the second electrode 160 may be formed by the stacking of an emissive layer and at least one of a hole transport layer, a hole injection layer, an electron transport layer, and an electron injection layer, in a single or a complex structure.

The organic layer 150 may be formed of a low molecular or polymeric organic material. The low molecular organic material may include copper phthalocyanine (CuPc), N,N'-Di(naphthalene-1-yl)-N,N'-diphenyl-benzidine (NPB), tris-8-hydroxyquinoline aluminum (Alq3). The polymeric organic layer that uses a polymeric organic material may be formed by inkjet printing or spin coating by using poly-(2,4)-ethylene-dihydroxy thiophene (PEDOT) or polyaniline (PANI) and a polymeric organic light-emitting layer may use PPV, soluble PPV's, cyano-PPV, polyfluorene, etc.

The emissive layer may be a stack type or a tandem type. The stack-type emissive layer may be formed as red, green, blue sub emissive layers and their stacking order is not particularly limited. For the stack-type emissive layer, all the red, green, and blue emissive layers may be fluorescent or at least one of them may be phosphorescent. For the tandem-type emissive layer, all the red, green, and blue emissive layers may be fluorescent or at least one of them may be phosphorescent. In addition, for the tandem-type emissive layer, each emissive layer that is stacked on both sides of a charge generation layer (CGL) may emit white lights, different color lights, or the same color light. In this case, different color lights or the same color light may be monochrome or polychrome.

The structures of the sub emissive layers of each pixel may be different, and if it is possible to represent a white light, combinations of various colors without limitation to red, green, and blue may be formed.

In addition, the OLED includes a substrate; a display unit arranged on the substrate; and a sealing layer covering the display unit, and the sealing layer may be formed by the alternate stacking of one or more organic layers and one or more inorganic layers.

Each of the inorganic layer or the organic layer may be formed in plurality.

The organic layer is formed of polymers and may be single layer or a stacked layer that is formed of any one of polyethyleneterephtalate, polyimide, polycarbonate, epoxy, polyethylene, and polyacrylate. The organic layer may be formed of polyacrylate, and includes a material that is formed by polymerization of a monomer composition including diacrylate-based monomer and triacrylate-based monomer. The monomer composition may further include monoacrylate-based monomer. In addition, the monomer composition may further include a known photo-initiator such as thermoplastic polyolefin (TPO).

The inorganic layer may be a single layer or a stacked layer that includes a metal oxide or a metal nitride. In particular, the inorganic layer may include any one of SiNx, Al2O3, SiO2, and TiO2.

The top layer exposed to the outside of the sealing layer may be formed of an inorganic layer to prevent moisture from penetrating the OLED.

The sealing layer may include at least one sandwich structure in which at least one organic layer is inserted between at least two inorganic layers. In addition, the sealing layer may include at least one sandwich structure in which at least one inorganic layer is inserted between at least two organic layers.

The sealing layer may include a first inorganic layer, a first organic layer, and a second inorganic layer sequentially from the upper part of the display unit. In addition, the sealing layer may include a first inorganic layer, a first organic layer, a second inorganic layer, a second organic layer, and a third inorganic layer sequentially from the upper part of the display unit. In addition, the sealing layer may include a first inorganic layer, a first organic layer, a second inorganic layer, a second organic layer, a third inorganic layer, and a fourth inorganic layer sequentially from the upper part of the display unit.

A metal halide layer including LiF may be further included between the display unit and the first inorganic layer. The metal halide layer may prevent the display unit from becoming damaged when forming the first inorganic layer by sputtering or plasma deposition.

The first organic layer is characterized in that its area is narrower than that of the second inorganic layer, and the second organic layer may also be narrower than the third inorganic layer. In addition, the first organic layer is characterized by being completely covered by the second inorganic layer, and the second organic layer may also be completely covered by the third inorganic layer.

Figure 4:
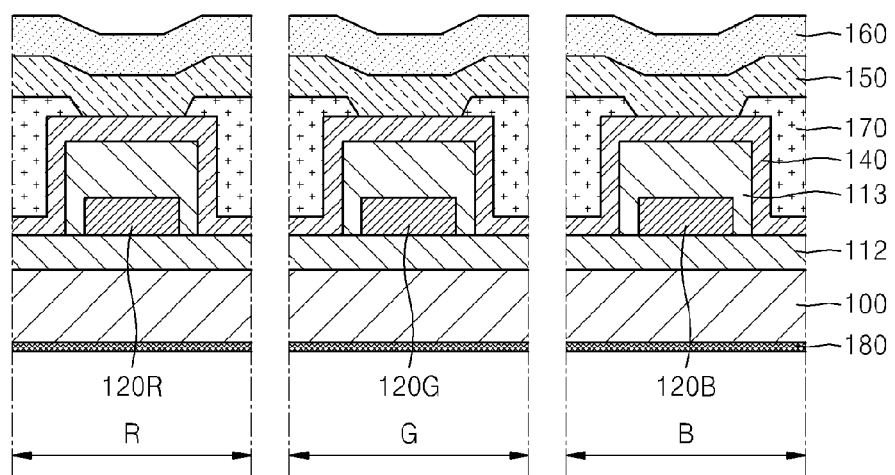
FIG. 4 is a sectional view schematically illustrating three neighboring pixels R, G, and B in an organic light-emitting display device according to another embodiment of the present invention implementing the circuit of FIG. 1.

FIG. 4 is a sectional view schematically illustrating three neighboring pixels R, G, and B in an organic light-emitting display device according to another embodiment of the present invention implementing the circuit of FIG. 1. In this embodiment, the same reference numerals as those in figures described previously indicate the same members that perform the same functions.

The present embodiment will be descried with the difference from the embodiment of FIG. 2 described previously.

Referring to FIG. 4, a polarizing film 180 may be further disposed on one side of the substrate 100. Since the polarizing film 180 is disposed on the substrate on which images are represented, a problem with a bright room contrast may be solved.

Figure 5:
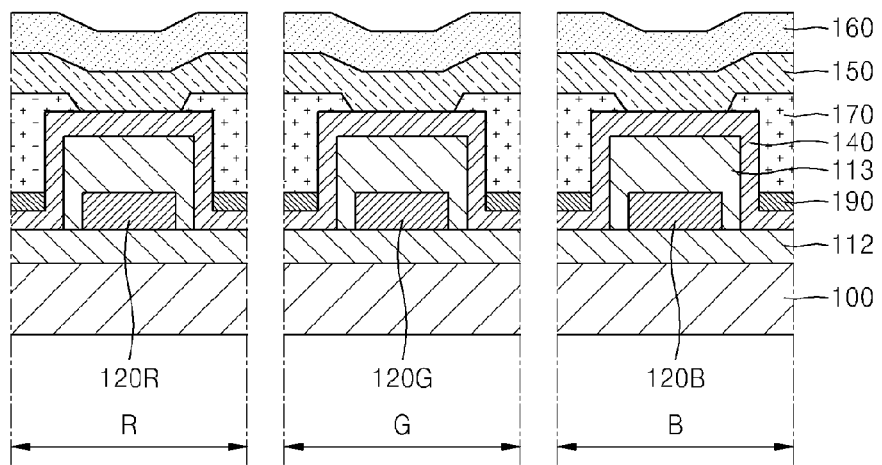
FIG. 5 is a sectional view schematically illustrating three neighboring pixels R, G, and B in an organic light-emitting display device according to another embodiment of the present invention implementing the circuit of FIG. 1.
Figure 6:
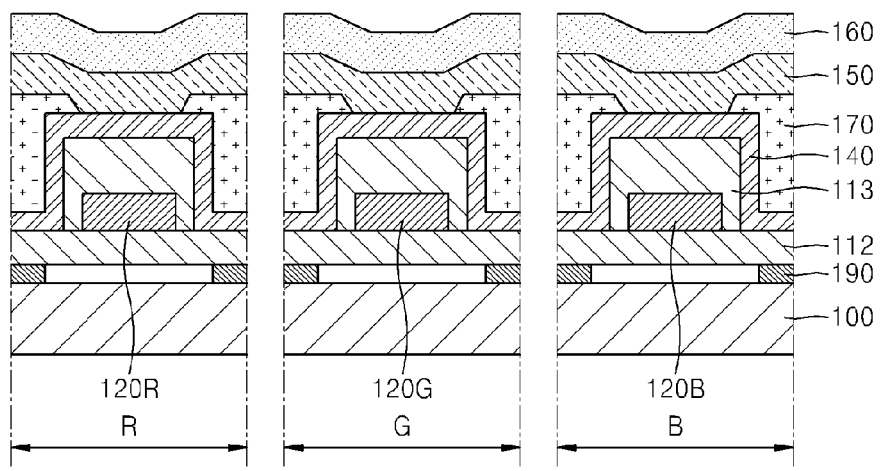
FIG. 6 is a sectional view schematically illustrating three neighboring pixels R, G, and B in an organic light-emitting display device according to another embodiment of the present invention implementing the circuit of FIG. 1.

FIG. 5 is a sectional view schematically illustrating three neighboring pixels R, G, and B in an organic light-emitting display device according to another embodiment of the present invention implementing the circuit of FIG. 1, and FIG. 6 is a sectional view schematically illustrating three neighboring pixels R, G, and B in an organic light-emitting display device according to another embodiment of the present invention implementing the circuit of FIG. 1. In this embodiment, the same reference numerals as those in figures described previously indicate the same members that perform the same functions.

The present embodiment will be descried with the difference from the embodiment of FIG. 2 described previously.

Referring to FIG. 5, a black matrix 190 that is formed as a light transmitting region and a light blocking region may be further included on the first electrode 140. Thus, light is blocked at a region where the black matrix 190 is formed.

Referring to FIG. 6, a black matrix 190 that is formed as a light transmitting region and a light blocking region may be further included between the substrate 100 and the passivation layer 112. Thus, light is blocked at a region where the black matrix 190 is formed.

Although the embodiments according to FIGS. 2, 4, 5, and 6 described above represent a bottom emission type in which light is emitted in the direction of the substrate 100, the present invention is not limited thereto but may be equally applied to a top emission type. In such embodiments, the lower electrode of each pixel may be formed of a reflective electrode and its upper electrode may be formed of a transparent electrode. A color filter corresponding to each pixel may be disposed on the upper part of the transparent electrode in a stack manner or on a separate substrate.

FIGS. 7A to 7H illustrate, step by step, a method of manufacturing an organic light-emitting display device according to another embodiment of the present invention implementing the circuit of FIG. 1.

Figure 7A:
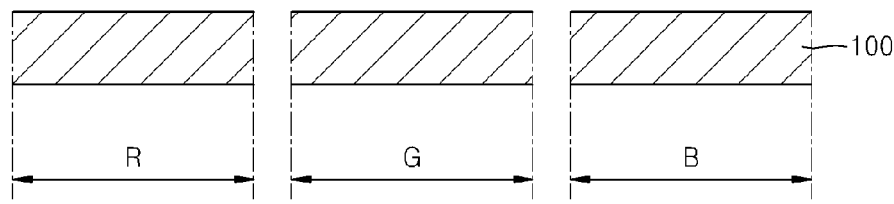
FIGS. 7A to 7H are sectional views illustrating, step by step, a method of manufacturing an organic lighting-emitting display device according to another embodiment of the present invention implementing the circuit of FIG. 1.

Referring to FIG. 7A, the substrate 100 is provided. The black matrix 190 (see FIG. 6) may be formed on the substrate 100 as a light transmitting region and a light blocking region.

Figure 7B:
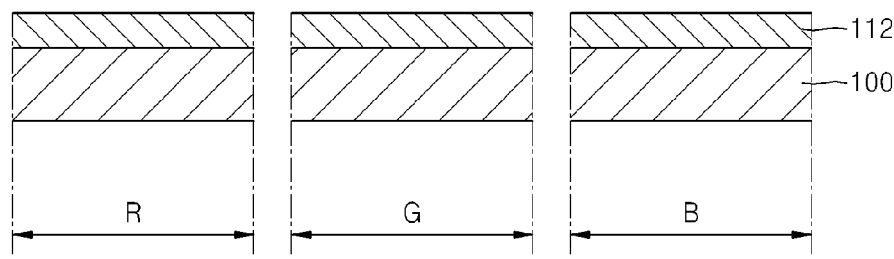

Referring to FIG. 7B, the passivation layer 112 is disposed on the substrate 100. The passivation layer 112 may be formed of a SiOx-based layer or a SiNx-based layer.

Figure 7C:
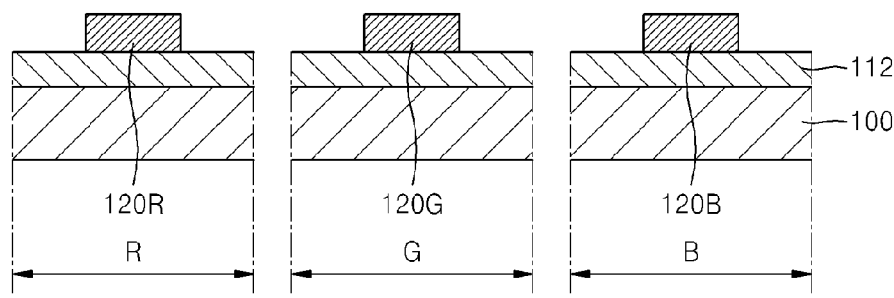

Referring to FIG. 7C, at least one color filter 120R, 120G, and 120B is disposed on the passivation layer 112. The thickness of the color filters 120R, 120G, and 120B may be formed to be 1 about μm to about 5 μm.

Figure 7D:
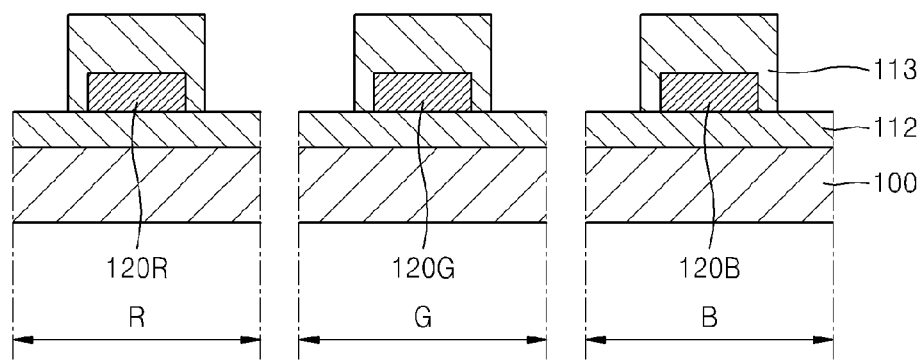

Referring to FIG. 7D, the overcoat layers 113 that cover the color filters 120R, 120G, and 120B are disposed. The thicknesses of the overcoat layers 113 may be formed to be about 1 μm to about 10 μm.

Figure 7E:
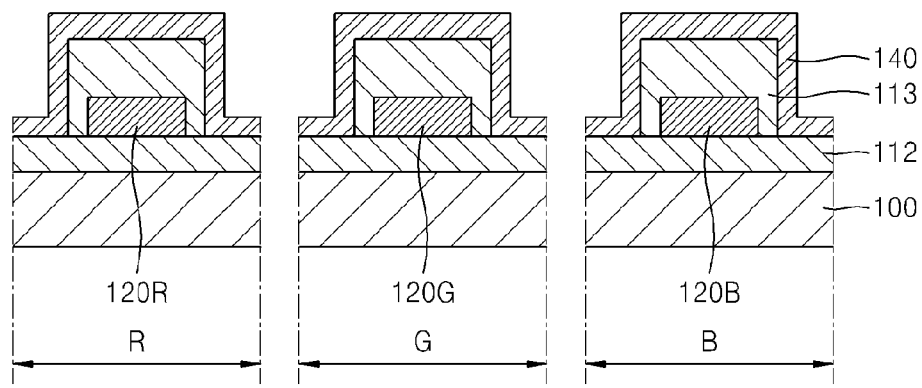

Referring to FIG. 7E, the first electrode 140 is formed on the passivation layer 112 to surround the overcoat layer 113. The first electrode 140 may be formed of a conductive material such as ITO, IZO, ZnO, or In2O3. The first electrode 140 may be wholly disposed on the substrate 100. The first electrode 140 may be formed so that a given pattern is formed pixel by pixel by photolithography. The overcoat layers 113 individually cover each color filter 120R, 120G, 120B and the first electrode 140 is formed to surround the overcoat layers 113. Thus, a structure in which each of the color filters 120R, 120G, and 120B is individually closed may be formed. Thus, outgases are effectively blocked to be able to prevent pixel shrinkage by the deterioration of an organic light-emitting layer. Even if leaks occur on the first electrode 140, it is possible to minimize defect due to pixel shrinkage because the spread of outgases is minimized.

The black matrix 190 (see FIG. 6) may be formed on the first electrode 140 as a light transmitting region and a light blocking region.

Figure 7F:
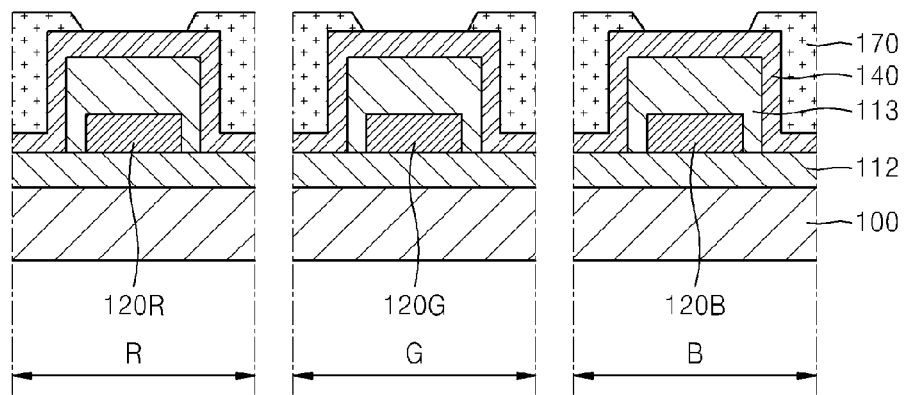
Figure 7G:
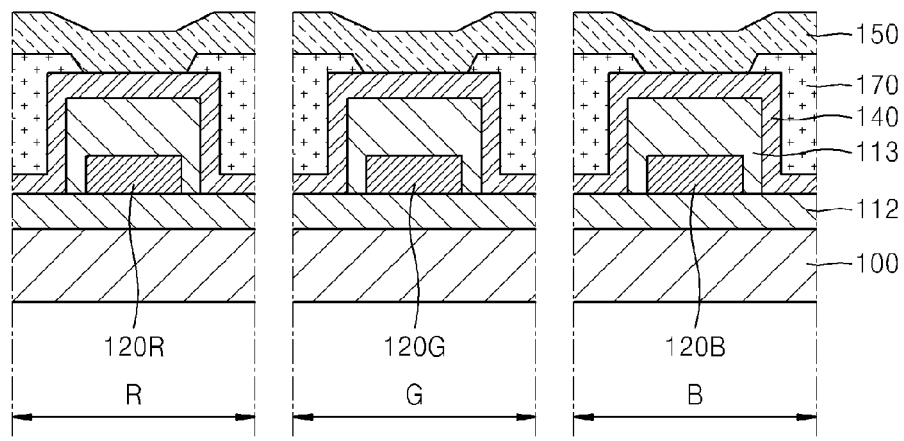
Figure 7H:
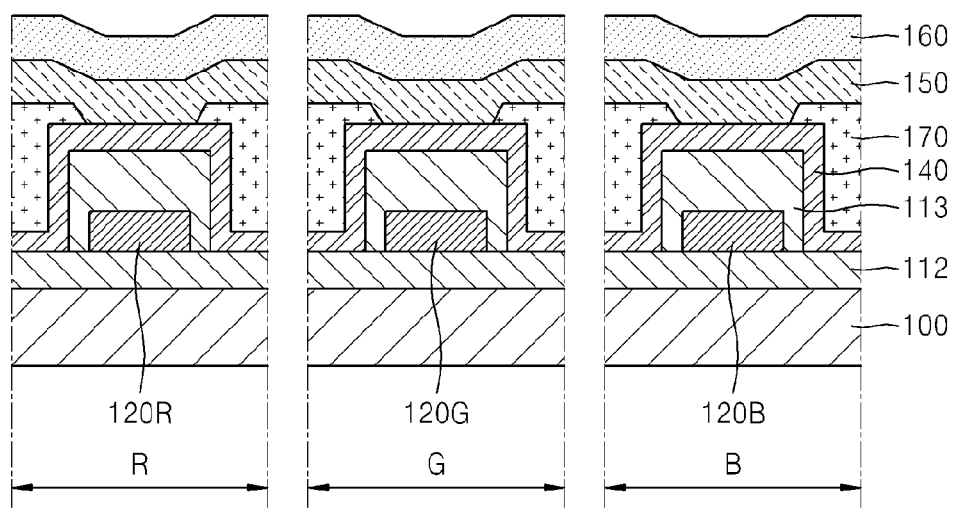

Referring to FIGS. 7F, 7G, and 7H, the pixel defining layer 170, the organic layer 150, and the second electrode 160 are disposed on the first electrode 140. After the first electrode 140 is disposed, the pixel defining layer 170 may be formed on the first electrode 140 as a pixel region and a non-pixel region. Subsequently, the organic layer 150 may be disposed on the first electrode 140 and the pixel defining layer 170 and the second electrode 160 may be disposed on the organic layer 150. Subsequently, disposing the polarizing film 180 (see FIG. 4) on one side of the substrate 100 may be further performed.

Those skilled in the art will understand that since elements shown in the accompanying drawings may be scaled up or down for convenience in description, the present invention is not constrained to the size or shape of the elements illustrated in the drawings, rather various variations and other equivalent embodiments are also contemplated. Thus, the true technical protective scope of the present invention will be defined by the following claims.

According to an aspect of the present invention, there is an effect that may enhance the reliability of a product by preventing pixel shrinkage by the deterioration of an organic light-emitting layer.

While the present invention has been particularly shown and described with reference to certain embodiments thereof, it will be understood by those of ordinary skill in the art that various changes in form and details may be made therein without departing from the spirit and scope of the present invention as defined by the following claims.

What is claimed is:

1. An organic light-emitting display device comprising:
   a substrate;
   a passivation layer disposed on the substrate;
   at least one color filter disposed on the passivation layer;
   an overcoat layer covering the at least one color filter, wherein the overcoat layer comprises an inorganic layer;
   a first electrode disposed on and contacting the passivation layer and surrounding the overcoat layer;
   a second electrode facing the first electrode; and
   an organic layer disposed between the first electrode and the second electrode.

2. The display device of claim 1, wherein the at least one color filter is one of a red filter, a green filter, or a blue filter.

3. The display device of claim 1, further comprising a polarizing film on one side of the substrate.

4. The display device of claim 1, further comprising a black matrix formed on the first electrode and including a light transmitting region and a light blocking region.

5. The display device of claim 1, further comprising a black matrix formed between the substrate and the passivation layer and including a light transmitting region and a light blocking region.

6. The display device of claim 1, further comprising a pixel defining layer formed on the first electrode and including a pixel region and a non-pixel region.

7. The display device of claim 1, wherein a thickness of the color filter is about 1 μm to about 5 μm.

8. The display device of claim 1, wherein a thickness of the overcoat layer is about 1 μm to about 10 μm.

9. The display device of claim 1, wherein the passivation layer comprises a SiOx or SiNx.

10. The display device of claim 1, wherein the first electrode is formed of one or more combinations selected from the group consisting of ITO, IZO, ZnO, and In$_2$O$_3$.

11. A method of manufacturing the organic light-emitting display device of claim 1, the method comprising:
   providing the substrate;
   disposing the passivation layer on the substrate;
   disposing the at least one color filter on the passivation layer;
   disposing the overcoat layer covering the at least one color filter;
   disposing the first electrode on the passivation layer to surround the overcoat layer;
   disposing the organic layer on the first electrode; and
   disposing the second electrode on the organic layer.

12. The method of claim 11, wherein the passivation layer is formed of a SiOx-based layer or a SiNx-based layer.

13. The method of claim 11, wherein the thickness of the color filter is formed to be about 1 μm to about 5 μm.

14. The method of claim 11, wherein the thickness of the overcoat layer is formed to be about 1 μm to about 10 μm.

15. The method of claim 11, further comprising forming a pixel defining layer on the first electrode and including a pixel region and a non-pixel region.

16. The method of claim 11, further comprising disposing a polarizing film on one side of the substrate.

17. The method of claim 11, further comprising forming a black matrix on the passivation layer and including a light transmitting region and a light blocking region.

18. The method of claim 11, further comprising forming a black matrix on the substrate and including a light transmitting region and a light blocking region.

19. The method of claim 11, wherein the first electrode is formed of one or more combinations selected from a group consisting of ITO, IZO, ZnO, and $In_2O_3$.

* * * * *